(12) United States Patent
Xiang et al.

(10) Patent No.: US 11,991,847 B2
(45) Date of Patent: May 21, 2024

(54) POWER SUPPLY MODULE HOUSING AND POWER SUPPLY MODULE COMPRISING SAME

(71) Applicant: VERTIV TECH CO., LTD., Guangdong (CN)

(72) Inventors: Xin Xiang, Shenzhen (CN); Xiang Zhang, Shenzhen (CN)

(73) Assignee: Vertiv Tech Co., Ltd., Guandong (CN)

( * ) Notice: Subject to any disclaimer, the term of this patent is extended or adjusted under 35 U.S.C. 154(b) by 227 days.

(21) Appl. No.: 17/606,418

(22) PCT Filed: Aug. 1, 2019

(86) PCT No.: PCT/CN2019/098830
§ 371 (c)(1),
(2) Date: Oct. 25, 2021

(87) PCT Pub. No.: WO2020/252855
PCT Pub. Date: Dec. 24, 2020

(65) Prior Publication Data
US 2022/0217864 A1    Jul. 7, 2022

(30) Foreign Application Priority Data

Jun. 18, 2019  (CN) .......................... 201920927974.2

(51) Int. Cl.
*H05K 5/02*    (2006.01)
*H05K 5/03*    (2006.01)

(52) U.S. Cl.
CPC ............. *H05K 5/03* (2013.01); *H05K 5/0217* (2013.01); *H05K 5/0247* (2013.01)

(58) Field of Classification Search
CPC ...... H05K 5/03; H05K 5/0217; H05K 5/0247; H05K 7/1495; H05K 7/20781;
(Continued)

(56) References Cited

U.S. PATENT DOCUMENTS 10,172,247 B2 * 1/2019 Lenz .................... H05K 5/0217
2001/0014029 A1 * 8/2001 Suzuki ............... H05K 7/20927
363/141

(Continued)

FOREIGN PATENT DOCUMENTS

CN    105635773 A  *  6/2016  ............. H04N 21/41
CN    106849326 A     6/2017
(Continued)

OTHER PUBLICATIONS

International Search Report (English and Chinese) and Written Opinion (Chinese) of the International Searching Authority issued in PCT/CN2019/098830, dated Mar. 25, 2020; ISA/CN (8 pages).
(Continued)

*Primary Examiner* — Rockshana D Chowdhury
*Assistant Examiner* — Martin Antonio Asmat Uceda
(74) *Attorney, Agent, or Firm* — Harness, Dickey & Pierce, P.L.C.

(57) ABSTRACT

Disclosed are a power supply module housing and a power supply module comprising same. The power supply module housing comprises a main housing, the main housing is provided with a maintenance and installation opening for facilitating the maintenance and installation of the power supply module, and a skylight cover plate detachably covers the maintenance and installation opening. The power supply module comprises the power supply module housing, a connecting terminal is installed in the power supply module housing, and the skylight cover plate is provided at the position corresponding to the connecting terminal. According to the present application, additionally providing the maintenance and installation opening and the skylight cover plate on a top cover enables wiring to be performed without removing the top cover in a field wiring work, thereby (Continued)

simplifying the steps of field wiring, and reducing the risk during work at height.

7 Claims, 2 Drawing Sheets

(58) Field of Classification Search
CPC .. H05K 7/20827; H05K 5/0208; H05K 5/061; H02M 7/003
See application file for complete search history.

(56) References Cited

U.S. PATENT DOCUMENTS

| | | | | |
|---|---|---|---|---|
| 2005/0266730 A1* | 12/2005 | Lanni | ................ | H02M 3/33507 439/131 |
| 2018/0054901 A1 | 2/2018 | Van Roon et al. | | |
| 2019/0165687 A1* | 5/2019 | Yamazawa | ......... | H05K 7/14327 |
| 2020/0231105 A1 | 7/2020 | Kogure et al. | | |
| 2020/0375042 A1 | 11/2020 | Tan et al. | | |

FOREIGN PATENT DOCUMENTS

| | | | |
|---|---|---|---|
| CN | 107134550 | A | 9/2017 |
| CN | 107528481 | A | 12/2017 |
| CN | 109742271 | A | 5/2019 |
| EP | 3166201 | A2 | 5/2017 |
| JP | 2017135765 | A * | 8/2017 |
| JP | 2017135765 | A | 8/2017 |
| JP | 2019071732 | A | 5/2019 |
| WO | 2019102792 | A1 | 5/2019 |

OTHER PUBLICATIONS

Extended European Search Report dated Aug. 4, 2022, in corresponding European Application No. 19934230.4.

* cited by examiner

POWER SUPPLY MODULE HOUSING AND POWER SUPPLY MODULE COMPRISING SAME

CROSS-REFERENCE TO RELATED APPLICATIONS

This application is a U.S. National Phase Application under 35 U.S.C. 371 of International Application No. PCT/CN2019/098830, filed on Aug. 01, 2019, which claims priority of Chinese Patent Application No. 201920927974.2, titled "POWER SUPPLY MODULE HOUSING AND POWER SUPPLY MODULE COMPRISING SAME", filed with the China National Intellectual Property Administration on Jun. 18, 2019, the entire disclosures of the above applications are expressly incorporated by reference herein.

FIELD

The present application relates to the technical field of power supply products, and in particular to a power supply module housing and a power supply module including the same.

BACKGROUND

In order to meet requirements against harsh outdoor environment such as high pollution, high radiation and the like, a power supply module, especially a natural cooling power supply module, adopts natural heat dissipation and a fully enclosed protection method for the cabinet to avoid the intrusion of corrosive gas, water mist and the like, which effectively protects internal electronic components of the natural cooling power supply module and prolongs service lives of the components. Meanwhile, in order to meet anti-theft requirements, the natural cooling power supply module adopts anti-theft screws to improve an anti-theft level of the power supply module. Due to the existence of the natural cooling power supply module with a sealed structure, in the case that a client access to mains supply or load, a top cover of the natural cooling power supply module needs to be removed to access to the mains supply or load, which may further cause a certain degree of loss in sealing performance of the natural cooling power supply module during this process.

SUMMARY

A technical problem to be solved by the present application is to provide a power supply module housing for facilitating maintenance and installation and a power supply module including the same.

In order to solve the above technical problem, technical solutions provided by the present application are as follows.

A power supply module housing includes a main housing, which is provided with a maintenance and installation opening for facilitating maintenance and installation of a power supply module, and the maintenance and installation opening is detachably covered with a skylight cover plate.

Further, the skylight cover plate and the main housing are respectively provided with multiple installation holes corresponding to each other.

Further, a long fastener or a short fastener penetrates through the installation holes.

Further, only one long fastener is provided; after the short fastener is detached from the main housing, the long fastener is connected to the main housing, and the skylight cover plate is capable of rotating around the long fastener.

Further, internal threads are provided on an inner bore surface of the installation hole provided on the skylight cover plate.

Further, the main housing includes a bottom housing and a top cover that are snap-fitted and mounted together, and the maintenance and installation opening is provided on the top cover.

Further, a stepped blocking surface is provided around the maintenance and installation opening, and the installation holes provided on the main housing are specifically provided on the blocking surface.

Further, a sealing rubber strip is fixed on the blocking surface.

Further, the top cover is further provided with a heat dissipating fin.

A power supply module, which includes the power supply module housing described above, wherein a connecting terminal is mounted inside the power supply module housing, and the skylight cover plate is provided at a position corresponding to the connecting terminal.

Beneficial effects of the present application are as follows.

In the present application, a maintenance and installation opening and a skylight cover plate are added to the top cover, so that the top cover does not need to be disassembled during field wiring, which simplifies procedures of field wiring and reduces risk during work at height. A long fastener with a relatively long length is provided at the upper left corner or upper right corner of the skylight cover plate, and the long fastener is preferably a screw, and the threaded post of the screw corresponding to the top cover is fully threaded, so that when the skylight cover plate is opened for wiring, the skylight cover plate and the top cover are still reliably connected, and may not completely fall off. Wiring is performed without completely disassembling the skylight cover plate. The short fastener adopts a structural design that can be loosened but may not fall off, and the short fastener is preferably a short screw. In the case that the short screws on the skylight cover plate are completely detached from the top cover, internal threads are also provided on installation holes of the skylight cover plate, so that the short fastener may not fall off from the skylight cover plate during wiring operations.

Figure 1:
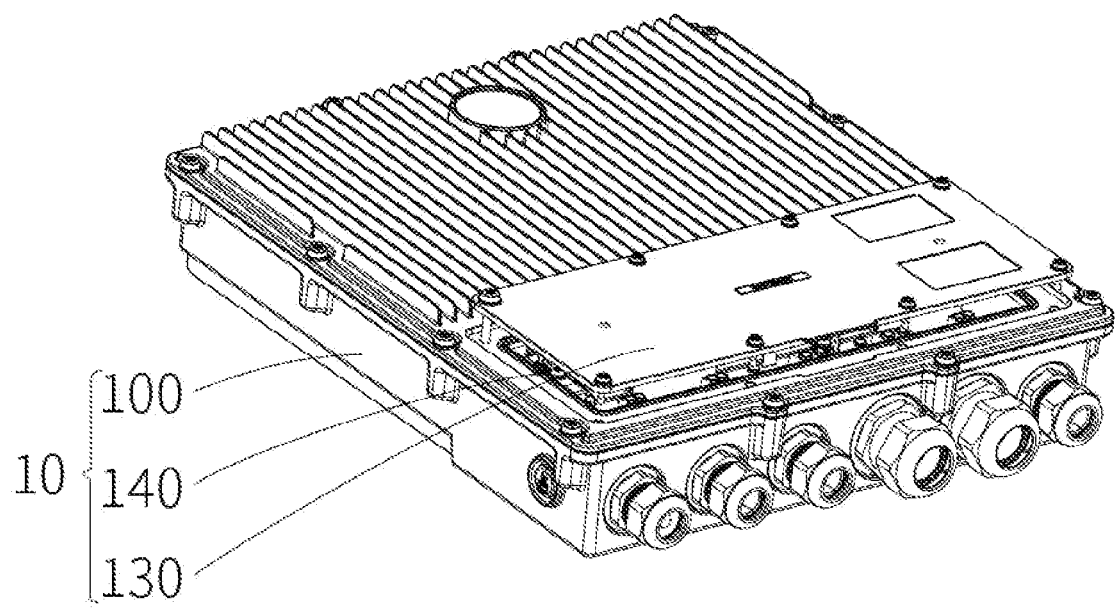
FIG. 1 is a structural schematic view of a power supply module of the present application when that short fasteners are loosened.

Reference numerals include:
10 power supply module housing
100 main housing
110 bottom housing
120 top cover
122 heat dissipating fin
130 skylight cover plate
121 installation hole
131 long fastener
132 short fastener
140 maintenance and installation opening
141 blocking surface
150 connecting terminal

DETAILED DESCRIPTION OF THE EMBODIMENTS

In order to make the technical problems to be solved by the present application, technical solutions and beneficial effects of the present application clearer, the present application will be further described in detail with reference to the accompanying drawings and embodiments. It can be understood that the embodiments described herein are only used to illustrate the present application, rather than a limitation to the present application.

Embodiment 1

Reference is made to FIG. 1, which shows a preferred embodiment of the present application. The power supply module housing 10 includes a main housing 100, which is provided with a maintenance and installation opening 140 for facilitating maintenance and installation of a power supply module, and the maintenance and installation opening 140 is detachably covered with a skylight cover plate 130. With the power supply module housing 10 of the present application, an operator only needs to open the skylight cover plate 130 to perform wiring operation, which simplifies procedures of field wiring and reduces risk during work at height. Each of the above components is respectively described in further detail below.

Figure 2:
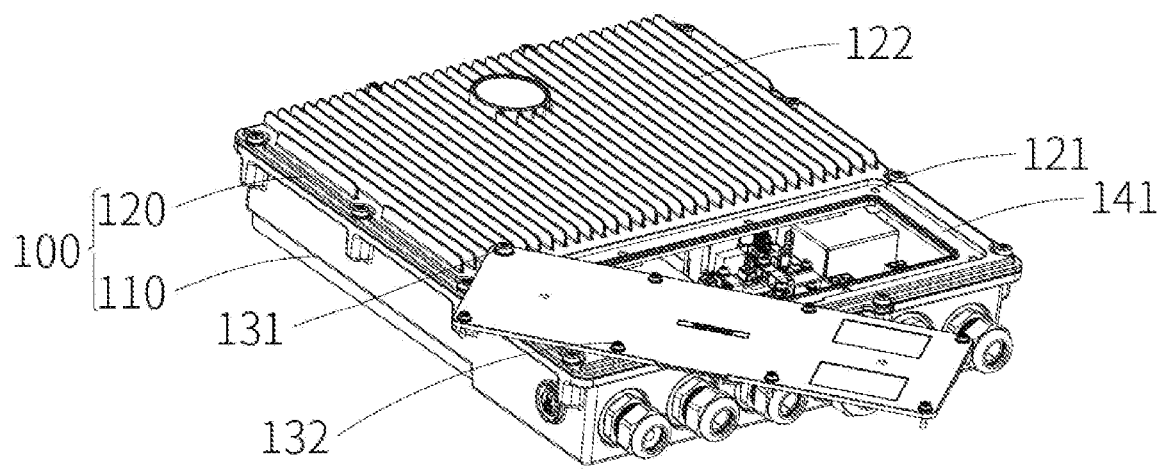
FIG. 2 is a structural schematic view of the present application after the skylight cover plate rotated a certain angle around a long fastener.

As shown in FIG. 2, the main housing 100 includes a bottom housing 110 and a top cover 120 that are snap-fitted and mounted together to form a closed internal cavity for installing electrical components. The power supply module housing 10 of the present application is a natural cooling power supply module housing, and the top cover 120 is further provided with heat dissipating fins 122. In the prior art, the top cover 120 needs to be disassembled, when a power supply module needs to be maintained or mounted, which may further cause a certain degree of loss in sealing performance of the main housing 100 during this process.

In the present application, the main housing 100 is provided with the maintenance and installation opening 140 for facilitating maintenance and installation of a power supply module. Specifically, as shown in FIG. 1, the maintenance and installation opening 140 is provided on the top cover 120, and the maintenance and installation opening 140 is detachably covered with the skylight cover plate 130. In the present application, when maintenance or installation is required, the wiring operation is performed only by disassembling the skylight cover plate 130 and opening the maintenance and installation opening 140, and there is no need to disassemble the top cover 120. This structure provides convenience for operators to operate at high altitudes, which also simplifies wiring procedures of the power supply module.

In order to meet requirements of high protection level of the power supply module and to ensure effective contact between the skylight cover plate 130 and the top cover 120, a step-shaped sinking blocking surface 141 is provided around the maintenance and installation opening 140. Correspondingly, the blocking surface 141 is provided with a groove, in which a sealing rubber strip is mounted. Of course, it can be understood that the present application does not limit a specific installation position of the sealing rubber strip, and the sealing rubber strip may also be fixed at a position of an inner surface of the skylight cover plate 130, which corresponds to the blocking surface 141.

Multiple installation holes 121 are provided on the blocking surface 141, and multiple installation holes 121 are also provided on the skylight cover plate 130. Each of the installation holes 121 on the blocking surface 141 corresponds to each of the installation holes on the skylight cover plate 130. A long fastener 131 or a short fastener 132 penetrates through the installation hole 121. The number of the long fastener 131 is only one. Specifically, the long fastener 131 is preferably a long screw, and the short fastener 132 is preferably a short screw.

Figure 3:
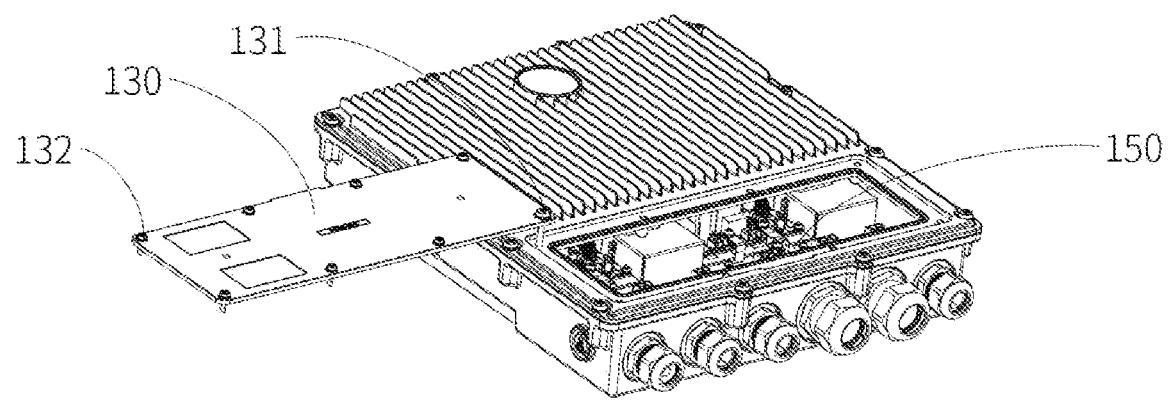
FIG. 3 is a structural schematic view of the present application after the skylight cover plate is fully opened.

For example, as shown in FIG. 2 and FIG. 3, a long screw with a relatively long length is set at the upper left corner or upper right corner of the skylight cover plate 130, when the skylight cover plate 130 is opened, only the remaining short screws need to be detached from the top cover 120, and the long screw is still connected to the top cover 120. The skylight cover plate 130 only needs to be rotated 180 degrees around the long screw during wiring operations, and there is no need to completely disassemble the skylight cover plate 130.

Further, in order to facilitate high-altitude operation and reduce risk of falling objects from height, the short fasteners 132 adopt a structural design that can be loosened but may not fall off. When the short fasteners 132 on the skylight cover plate 130 are completely detached from the threads of the top cover 120, the installation holes 121 of the skylight cover plate 130 are also provided with internal threads, so that the short fasteners 132 may not fall off from the skylight cover plate 130 during wiring operations.

In the present application, the maintenance and installation opening 140 and the skylight cover plate 130 are added to the top cover 120, so that the top cover 120 does not need to be disassembled during field wiring, which simplifies procedures of field wiring and reduces risk during work at height. A long fastener 131 with a relatively long length is provided at the upper left corner or upper right corner of the skylight cover plate 130, and the long fastener 131 is preferably a screw, and a threaded post of the screw corresponding to the top cover 120 is fully threaded, so that when the skylight cover plate 130 is opened for wiring, the skylight cover plate 130 and the top cover 120 are still reliably connected, and may not completely fall off. Wiring is performed without completely disassembling the skylight cover plate 130. The short fasteners 132 adopt a structural design that can be loosened but may not fall off, and the short fasteners are preferably short screws. When the short screws on the skylight cover plate 130 are completely detached with the top cover 120, internal threads are further provided on installation holes 121 of the skylight cover plate 130, so that the short fasteners 132 may not fall off from the skylight cover plate 130 during wiring operations.

Embodiment 2

A power supply module, as shown in FIG. 3, includes the power supply module housing 10 described in Embodiment 1. Connecting terminals 150 are mounted inside the power supply module housing 10, and the skylight cover plate 130 is provided at a position corresponding to the connecting terminals 150, which facilitates an operator to perform maintenance or installation operations.

The above content is only the preferred embodiments of the present application. For those of ordinary skills in the art, many changes may be made to embodiments and application fields according to ideas of the present application, which all fall into the protection scope of the present application as long as these changes do not depart from the concept of the present application.

The invention claimed is:

1. A power supply module housing, comprising a main housing, wherein the main housing is provided with a maintenance and installation opening for facilitating maintenance and installation of a power supply module, the maintenance and installation opening is detachably covered with a skylight cover plate,
   wherein the skylight cover plate and the main housing are respectively provided with a plurality of installation holes that correspond to each other,
   a first fastener penetrates through a first installation hole of the plurality of installion holes and a second fastener penetrates through a second installation hole of the plurality of installation holes, and
   a number of the first fastener is only one, and the first fastener is longer than the second fastener such that after the second fastener is detached from the main housing, the first fastener remains connected to the main housing, which permits the skylight cover plate to rotate around the first fastener.

2. The power supply module housing according to claim 1, wherein internal threads are provided on an inner bore surface of each of the plurality of installation holes provided on the skylight cover plate.

3. The power supply module housing according to claim 1, wherein the main housing comprises a bottom housing and a top cover that are snap-fitted and mounted together, and the maintenance and installation opening is provided on the top cover.

4. The power supply module housing according to claim 3, wherein a step-shaped blocking surface is provided around the maintenance and installation opening, and the plurality of installation holes provided on the main housing are specifically provided on the blocking surface.

5. The power supply module housing according to claim 4, wherein a sealing rubber strip is fixed on the blocking surface.

6. The power supply module housing according to claim 3, wherein the top cover is further provided with a heat dissipating fin.

7. A power supply module, wherein the power supply module comprises the power supply module housing according to claim 1, a connecting terminal is mounted inside the power supply module housing, and the skylight cover plate is provided at a position corresponding to the connecting terminal.

\* \* \* \* \*